(12) United States Patent
Cardi et al.

(10) Patent No.: US 11,967,536 B2
(45) Date of Patent: Apr. 23, 2024

(54) ELECTRONIC POWER UNIT AND SEMICONDUCTOR POWER MODULE

(71) Applicant: SEMIKRON ELEKTRONIK GMBH & CO. KG, Nuremberg (DE)

(72) Inventors: Valeriano Cardi, Rome (IT); Stefan Hopfe, Schwaig (DE); Maurilio Giovannantonio Muscolino, Anzio (IT); Matteo Santoro, Pomezia (IT); Werner Obermaier, Hamburg (DE)

(73) Assignee: SEMIKRON ELEKTRONIK GMBH CO., KG, Nuremberg (DE)

( * ) Notice: Subject to any disclaimer, the term of this patent is extended or adjusted under 35 U.S.C. 154(b) by 414 days.

(21) Appl. No.: 17/481,986

(22) Filed: Sep. 22, 2021

(65) Prior Publication Data

US 2022/0102227 A1    Mar. 31, 2022

(30) Foreign Application Priority Data

Sep. 30, 2020  (EP) .................................. 20199403

(51) Int. Cl.
| | |
|---|---|
| H01L 23/053 | (2006.01) |
| H01L 23/13 | (2006.01) |
| H01L 23/40 | (2006.01) |
| H01L 23/498 | (2006.01) |

(52) U.S. Cl.
CPC ............ *H01L 23/053* (2013.01); *H01L 23/13* (2013.01); *H01L 23/40* (2013.01); *H01L 23/49811* (2013.01)

(58) Field of Classification Search
CPC ....... H01L 23/053; H01L 23/13; H01L 23/40; H01L 23/49811

USPC .......................................................... 257/69
See application file for complete search history.

(56) References Cited

U.S. PATENT DOCUMENTS

| | | | |
|---|---|---|---|
| 11,145,571 B2* | 10/2021 | Yoo ...................... | H01L 21/4882 |
| 2015/0097281 A1* | 4/2015 | Adachi ................. | H01L 23/473 |
| | | | 257/714 |
| 2016/0020161 A1* | 1/2016 | Suzuki ................ | H01L 21/4882 |
| | | | 228/123.1 |

FOREIGN PATENT DOCUMENTS

| | | |
|---|---|---|
| DE | 10063714 A1 | 7/2002 |
| DE | 102015213495 A1 | 3/2016 |
| EP | 1 217 659 A2 | 6/2002 |
| EP | 3 340 291 A1 | 6/2018 |
| JP | 2000 200865 A | 7/2000 |

OTHER PUBLICATIONS

EP 20199403.5, European Search Report dated Mar. 31, 2021, 5 pages—German.

* cited by examiner

*Primary Examiner* — Xia L Cross
(74) *Attorney, Agent, or Firm* — Andrew F. Young; NOLTE LACKENBACH SIEGEL

(57) ABSTRACT

An electronic power unit has a substrate with a perpendicular direction and a flat insulating molded body has a metal layer on a first main face and conductor tracks on a second main face. The substrate is in a non-positive locking or materially-bonded manner on a base plate of the electronic power unit. A first fastening device is on the base plate in a non-positive locking manner on a cooling device or a housing section has a second fastening device provided to arrange the substrate in a non-positive locking manner on a cooling device.

14 Claims, 4 Drawing Sheets

ELECTRONIC POWER UNIT AND SEMICONDUCTOR POWER MODULE

CROSS REFERENCE TO RELATED APPLICATIONS

This application relates to and claims priority to EP 20 199 403.5 filed Sep. 30, 2020, the entire contents of which are incorporated herein fully by reference.

FIGURE SELECTED FOR PUBLICATION

FIG. 2

BACKGROUND OF THE INVENTION

Field of the Invention

An electronic power unit has a substrate having a flat insulating molded body that has a metal layer on its first main face and a plurality of conductor tracks on its second main face, and having a first or second fastening device that is preferably embodied as a cylindrical cut-out, wherein either the substrate is arranged on a base plate of the electronic power unit and the first fastening device is configured so as to arrange the base plate in a non-positive locking manner on a cooling device or wherein a housing section has a second fastening device that is embodied so as to arrange the substrate on a cooling device. The invention furthermore describes a semiconductor power module having an electronic power unit of this type.

Description of the Related Art

In the case of semiconductor power modules, it is fundamentally necessary to configure such semiconductor power modules in a robust manner, in particular it is always a challenge when attaching said semiconductor power modules to cooling devices not to exert a force on the electronic power unit of such a semiconductor power module that can lead to mechanical impairment.

DE 100 63 714 A1 discloses a semiconductor power module comprising a ceramic substrate that is metal-clad on both sides, having at least one semiconductor component, connections required for producing a contact and a housing, wherein the ceramic substrate also provides an insulating function in addition to the basic insulation. The ceramic substrate has a metal cladding that only covers in part the first or second surface of the ceramic, wherein the distance of the metal edge of the first metal cladding to the edge of the ceramic is smaller than the distance of the metal edge of the second metal cladding to the edge of the ceramic and this acts to increase the insulating strength of the basic installation of the substrate.

ASPECTS AND SUMMARY OF THE INVENTION

According to one aspect of the present invention, there is provided a semiconductor power module having an electronic power unit having a substrate that has a perpendicular direction and has a flat insulating molded body that has a metal layer on its first main face and a plurality of conductor tracks on its second main face, and having a first or second fastening device, wherein either the substrate is arranged in a non-positive locking or materially-bonded manner on a base plate of the electronic power unit and the first fastening device is embodied and provided so as to arrange the base plate in a non-positive locking manner on a cooling device or wherein alternatively a housing section has a second fastening device that is embodied and provided so as to arrange the substrate in a non-positive locking manner on a cooling device and wherein an edge of the metal layer is offset to the rear with respect to an edge of the insulating molded body and wherein in the region adjacent to the first or second fastening device a first edge section of the edge of the metal layer is offset to the rear further than in each case adjoining second and third edge sections of the edge of the metal layer.

One adaptive and alternative object of the invention is to embody an electronic power unit and a semiconductor power module hereby in such a manner by virtue of fastening said electronic power unit to a cooling device the effect of force on the electronic power unit is reduced.

This object is achieved in accordance with the invention by an electronic power unit having a substrate that has a perpendicular direction and has a flat insulating molded body that has a metal layer on its first main face and a plurality of conductor tracks on its second main face, and having a first or second fastening device that is preferably embodied as a cylindrical cut-out, wherein either the substrate is arranged in a non-positive locking or materially-bonded manner on a base plate of the electronic power unit and the first fastening device is embodied and provided so as to arrange the base plate in a non-positive locking manner on a cooling device or wherein alternatively a housing section has a second fastening device that is embodied and provided so as to arrange the substrate in a non-positive locking manner on a cooling device and wherein an edge of the metal layer is offset to the rear with respect to an edge of the insulating molded body and wherein in the region adjacent to the first or second fastening device a first edge section of the edge of the metal layer is offset to the rear further than in each case adjoining second and third edge sections of the edge of the metal layer.

It can be advantageous if the conductor tracks are embodied from a further metal layer that is itself structured and is preferably embodied in an identical manner to the metal layer on the first main face, or it differs from the metal layer on said first main face only by having a different thickness.

It can be particularly advantageous if the first edge section has a length of at least five times, preferably at least ten times and preferably a maximum fifty times the thickness of the metal layer.

It is preferred that the materially bonded connection is embodied in this case as a solder or sinter connection. It is then particularly advantageous if the first edge section has a minimum perpendicular distance from the first fastening device, to be more precise from a central middle axis that extends through said first fastening device, of at least ten times, preferably at least twenty-five times and preferably a maximum three hundred times the thickness of the materially bonded connection.

Advantageously, the first edge section has a concave, straight or convex progression. In particular, it is advantageous if the first edge section in the case of a concave progression describes a circle segment, having when viewed in the perpendicular direction a middle point of the circle segment within the cover area preferably centrally in the cover area of the first or second fastening device that is embodied as a cylindrical cut-out. Alternatively, it can be advantageous if the first edge section in the case of a concave progression describes a circle segment, having when viewed in the perpendicular direction a middle point of the circle segment in the region between the first fastening device and the adjacent edge of the base plate. Likewise, alternatively, it can be advantageous if the first edge section in the case of a concave progression describes a circle segment, having when viewed in the perpendicular direction a middle point of the circle segment in the region between the second fastening device and the adjacent edge of the housing section.

The object is furthermore achieved by means of a semiconductor power module having an aforementioned electronic power unit having a power semiconductor component, arranged on one of the conductor tracks of the substrate, having an internal connection device and having connection elements for the external connection in an electrical manner of the substrate. It is preferred that the connection elements in this case are embodied as load and auxiliary connection elements and protrude outwards preferably through a housing.

It can be advantageous if the substrate is arranged in a non-positive locking or material-bonded manner on a base plate of the electronic power unit and the first fastening device is embodied as a cylindrical cut-out. In this case, it is preferred that a housing has a further cylindrical cut-out that is flush with the fastening device that is embodied as a cylindrical cut-out.

By virtue of this configuration, the mechanical loading of the substrate is effectively reduced.

It is naturally possible, insofar as this is not excluded per se or explicitly, for the features mentioned in the singular, in particular the fastening device or the power semiconductor component, to also be present more than once in the electronic power unit in accordance with the invention or the semiconductor power module in accordance with the invention.

It goes without saying that the different embodiments of the invention, regardless of whether they are disclosed within the scope of the description of the electronic power unit or of the semiconductor power module, can be realized individually or in any combinations in order to realize the improvements. In particular, the features mentioned and explained above and below are not only usable in the stated combinations but can also be used in other combinations or as stand-alone without departing the scope of the present invention.

Further explanations of the invention, advantageous details and features are disclosed in the description below of the exemplary embodiments of the invention that are illustrated schematically in FIGS. 1 to 10 or of respective parts thereof.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
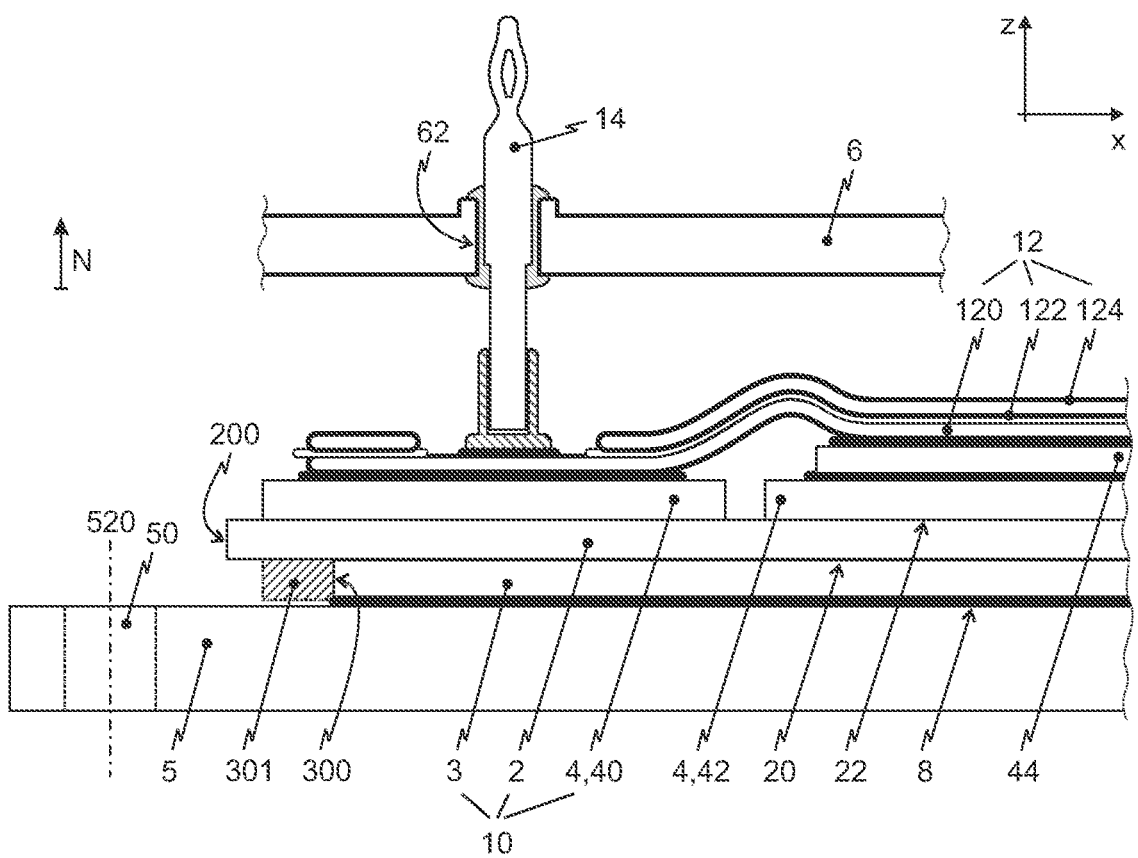
FIG. 1 illustrates a side view of a first fundamental embodiment of a semiconductor power module in accordance with the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 illustrates a side view of a first fundamental embodiment of a semiconductor power module in accordance with the invention. This has a substrate 10, having an insulating molded body 2 and arranged on its second main face 22 a first and a second conductor track 40, 42. A power semiconductor components 44 is arranged on the second conductor track 42 of the substrate 10 and is connected thereto in an electrically conductive manner by its contact surface that is facing the second conductor track 42. This electrically conductive connection is embodied in this case without loss of generality as a materially bonded pressure sinter connection.

The power semiconductor component 44, to be more precise its contact surface that is remote from the substrate 10 in the perpendicular direction N, is connected to a first conductor track 40 by means of an internal connection device 12. This connection device 12 is embodied as a composite film comprising a first electrically conductive film 120 that is facing the substrate 10, an electrically insulating film 122 that follows on in the composite film, and a second electrically conductive film 124 that follows further on in the film composite.

The electronic power unit 1 has furthermore a connection element 14, in this case to be more precise an auxiliary connection element, for guiding auxiliary potentials, such as for example sensor or control signals. This connection element 14 is embodied as an industry standard press-fit contact element. The foot of this press-fit contact element is arranged in an electrically conductive manner in a sleeve, wherein the sleeve is connected in a materially-bonded manner to a contact section on the surface of the first electrically conductive film 120 that is remote from the substrate 10. The press-fit contact element extends through this through a cut-out 62 of a housing 6 of the semiconductor power module that is illustrated only in sections.

This first electrically conductive film 120 is connected to the first conductor track 40 of the substrate 10 by means of a materially bonded and electrically conductive connection, in this case embodied as an industry standard pressure sinter connection.

The substrate 10 has furthermore a metal layer 3 that is arranged on the first main face 20 of the insulating molded body 2. The conductor tracks 40, 42 are embodied on the second main face 22 from a further metal layer by virtue of structuring said main face. The insulating molded body 2 has in this case a thickness of 300 µm whereas the metal layers in each case have a thickness of 350 µm. These are typical values for substrates 10 of this type and also apply for the further exemplary embodiments.

The metal layer 3 is connected by means of a materially bonded connection 8 to a base plate 5 of the electronic power unit 1 and consequently of the semiconductor power module. This connection 8 has a thickness of approximately 150 µm and is embodied here as a solder connection. A likewise technically expedient alternative to this is a sinter connection, in particular a pressure sinter connection.

The baseplate 5 has in the edge region or, to be more precise, in this case in the corner region a first fastening device 50 that is configured in this case as a through-going cylindrical cut-out. In addition, the figure illustrates the middle axis 520 of this cut-out. This cut-out is provided for the purpose that consequently the semiconductor power module is fastened to a cooling device, typically in a non-positive locking manner.

Fundamentally and industry standard, the edge 300 of the metal layer 3 is offset to the rear with the respect to the edge 200 of the insulating molded body 2, as a result of which a peripheral edge section of the first main face 20 of the insulating molded body 2 is not covered by the metal layer 3. Adjacent to the first fastening device 50, the edge of the metal layer 300 is offset further to the rear in a first edge section 301 than in the respectively adjoining thereto second and third edge sections 302, 303, cf. FIGS. 3 to 10. This consequently produces an additional section of the first main face 20 of the insulating molded body 2 that is not covered by the metal layer 3. Further features of these edge sections, in particular with regard to their dimensioning, are described in particular in the case of FIG. 9.

Figure 2:
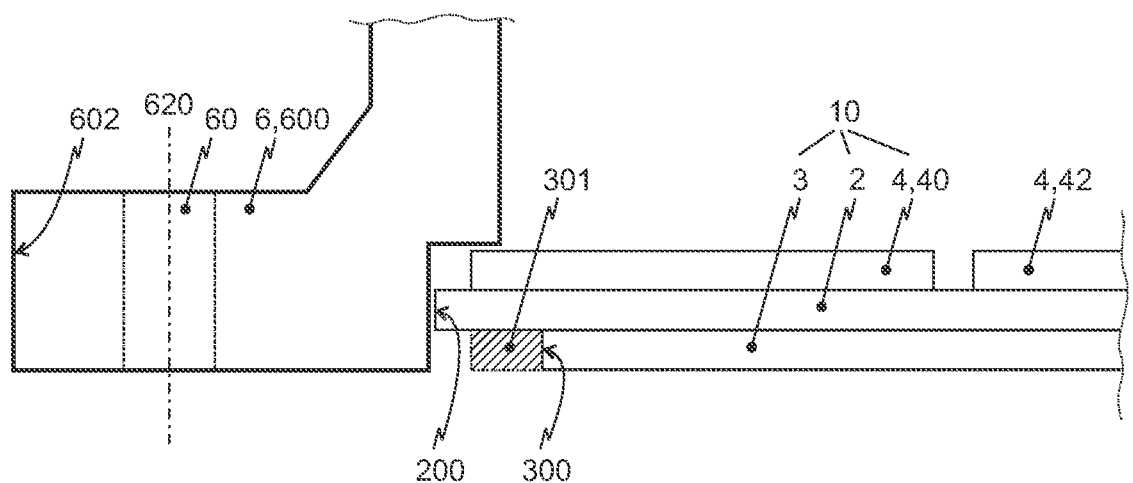
FIG. 2 illustrates a side view of a second fundamental embodiment of a semiconductor power module in accordance with the invention.

FIG. 2 illustrates a side view of a second fundamental embodiment of a semiconductor power module in accordance with the invention. In contrast to the first embodiment, this does not have a base plate. On the contrary, it is provided in this case for the substrate 10 to be arranged directly on a cooling device. Typically, but not absolutely necessary, in the case of embodiments of this type the substrate 10 is arranged in a non-positive locking manner on the cooling device.

The figure illustrates only the substrate 10 without power semiconductor components and without an internal connection device. A housing 6 is arranged around the periphery of the substrate 10 and industry-standard mostly also covering the substrate. This housing has in the edge region or in the corner region a second fastening device 60 that is configured in turn as a through-going cylindrical cut-out. In addition, the figure illustrates the middle axis 620 of this cut-out. This cut-out is provided for the purpose that consequently the semiconductor power module is fastened to the cooling device. The substrate 10 in this case is embodied completely identical to the first embodiment in accordance with FIG. 1.

Figure 3:
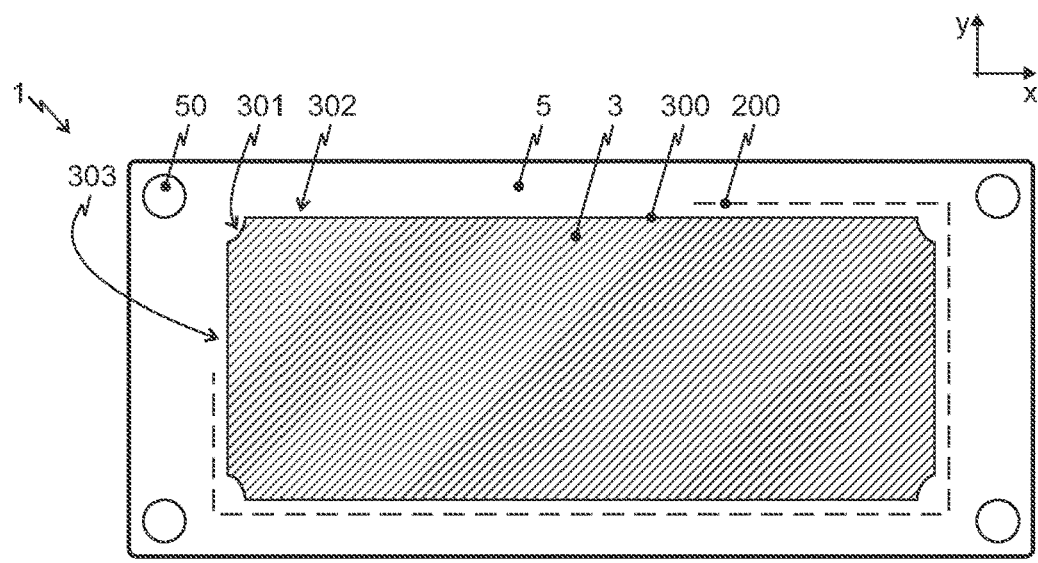
FIG. 3 illustrates a plane of a first embodiment of an electronic power unit in accordance with the invention.

FIG. 3 illustrates a plane of a first embodiment of an electronic power unit 1 in accordance with the invention. The figure illustrates in a plan view from the perpendicular direction N a section through the metal layer 3. The base plate 5 is arranged below this metal layer 3 and has in each case in the corner region a first fastening device 50 that has a diameter of 8 mm and more over is embodied as described with reference to FIG. 1.

The metal layer 3 has an edge 300 that is offset to the rear with respect to the edge 200 of the insulating molded body 2 that is illustrated in part by the dashed line. Adjacent to all first fastening devices 50 is in each case the first edge section 301 that is offset further to the rear with respect to the edge 200 of the insulating molded body 2. Adjoining this first section 301 on the longitudinal side of the electronic power unit 1 is a second edge section 302 that is designed in an industry standard manner and on the narrow side is a third edge section 303 that is likewise designed in an industry standard manner. These are consequently not offset to the rear to the same extent as the first section 301.

Figure 4:
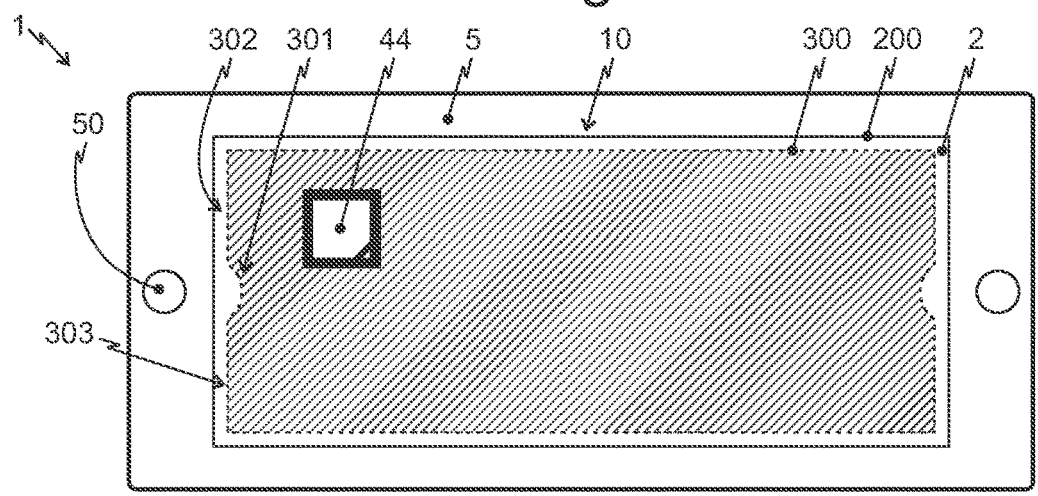
FIG. 4 illustrates a plane of a second embodiment of an electronic power unit in accordance with the invention.

FIG. 4 illustrates a plane of a second embodiment of an electronic power unit 1 in accordance with the invention. The figure illustrates a plan view N from the perpendicular direction N of the substrate 10, wherein conductor tracks are not illustrated and only the one illustrated power semiconductor component 44 is explained. The metal layer 3 is illustrated below the insulating molded body 2 by the dotted line. In turn, the base plate 5 is arranged below said molded body and said base plate has in this case on the narrow sides centrally in each case a first fastening device 50.

The metal layer 3 has in turn an edge 300 that is offset to the rear with respect to the edge 200 of the insulating molded body 2. Adjacent to all first fastening devices 50, is in each case a first edge section 301 that is offset further to the rear with respect to the edge 200 of the insulating molded body 2. In the further progression of the respective narrow side of the electronic power unit 1, a second and third edge section 302, 303 that are designed in an industry standard manner adjoin this first section 301 that is lying centrally on the narrow side. These are consequently in each case not offset to the rear to the same extent as the first section 301.

Figure 5:
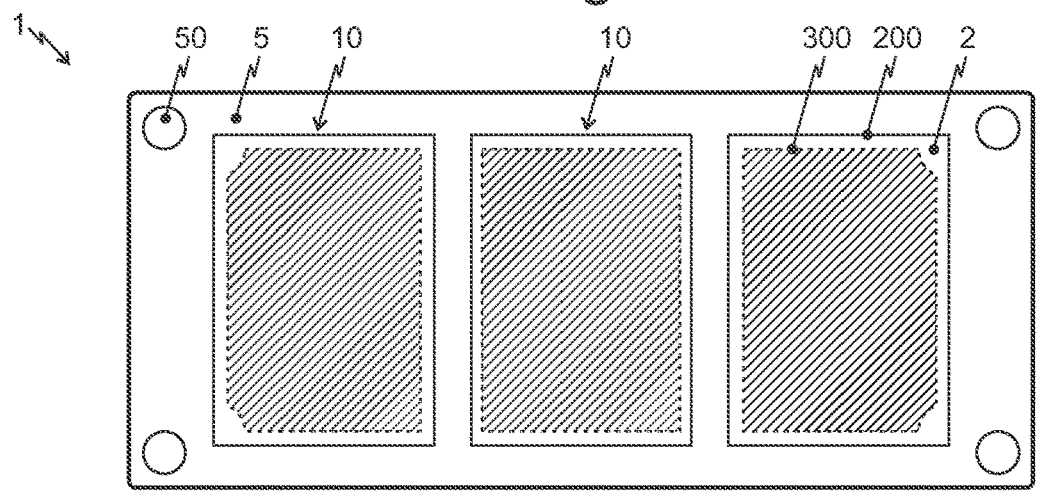
FIG. 5 illustrates a third embodiment of an electronic power unit in accordance with the invention.

FIG. 5 illustrates a third embodiment of an electronic power unit in accordance with the invention having a plurality of in this case by way of example three, substrates 10. Each substrate 10 that is arranged directly adjacent to a first fastening device 50 has in this figure a first edge section 301. This is embodied in each case as described with reference to FIG. 3.

FIGS. 6 to 10 illustrate detailed views of variants of the embodiments of an electronic power unit 1 in accordance with the invention, in particular of the region in which the first section 301 is arranged. FIGS. 6 to 9 illustrate in each case a corner region of a base plate 5 comparable to FIG. 3 or 5. This corner region has a first fastening device 50 that is embodied as a through-going cylindrical cut-out. The virtual cover area 500 thereof has a middle point 52 through which the middle axis 520 extends in a perpendicular manner in the Z direction, cf. FIG. 1. The insulating molded body 2, which has its edge 200, and the metal layer 3 on its first main face 20 is furthermore illustrated by the dashed line, cf. FIG. 1. The respective embodiments differ with regard to the embodiment of the first edge section 301. The second and third edge 302, 303 sections that respectively adjoin thereto are each configured in an identical manner as described with reference to FIGS. 3 and 5.

Figure 6:
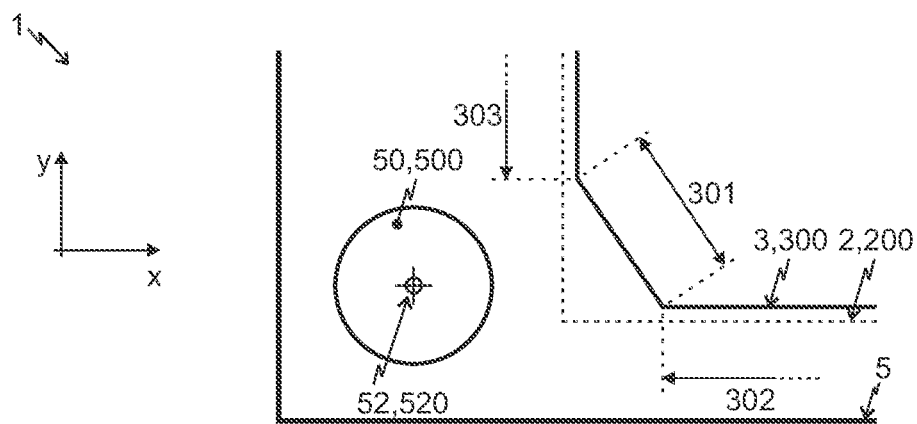
FIGS. 6 to 10 illustrate variants of the embodiment of the first edge section of an electronic power unit in accordance with the invention and fully within the scope of the present invention.
Figure 7:
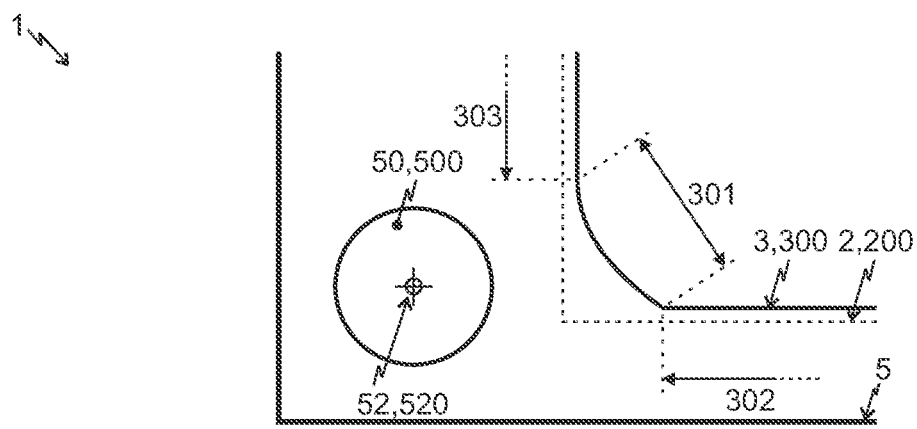
Figure 8:
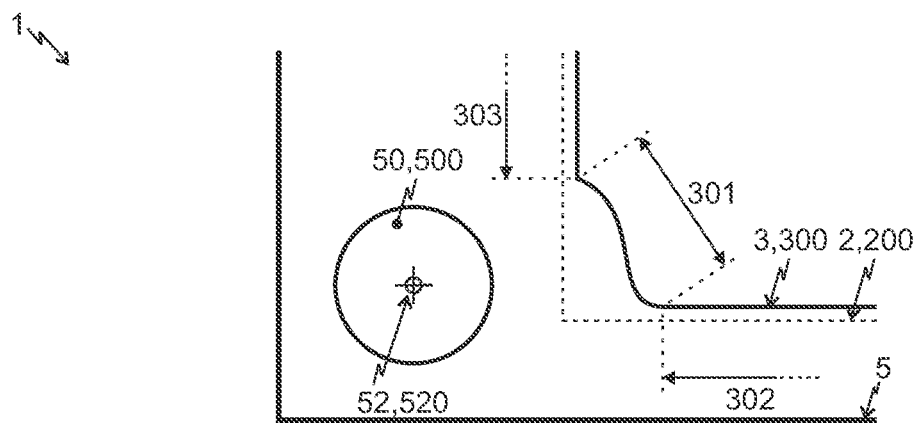

The first end section 301 of the embodiment in accordance with FIG. 6 is embodied as a bevel of the corner region having a straight progression. The first edge section 301 of the embodiment in accordance with FIG. 7 is embodied with a convex progression. In this case, purely by way of example in each case, the transition to the second end section 302 is embodied in a discontinuous manner whereas the transition to the third edge section 303 is embodied in a continuous manner. The first edge section 301 of the embodiment in accordance with FIG. 8 is embodied as an example for a curve-shaped progression having concave and convex, possibly also even straight, elements. In this case, purely by way of example in each case, the transition to the second end section 302 is embodied in a continuous manner whereas the transition to the third edge section 303 is embodied in a discontinuous manner.

Figure 9:
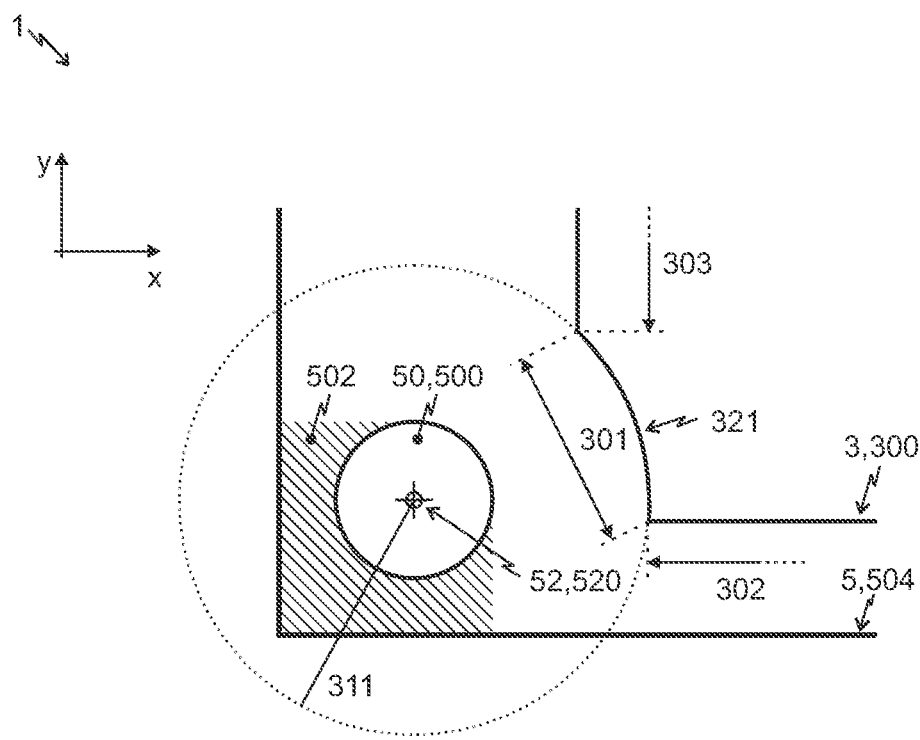

The first edge section 301 of the embodiment in accordance with FIG. 9 is embodied with a concave progression, in this case more specifically embodied as a circle segment 321. The middle point of the circle or of the circle segment 321 having a radius 311 lies in this case on the middle axis 520 that extends centrally through the first fastening device 50. Alternatively, the middle point of the circle segment 321 lies in the projection onto the surface of the base plate 5 at any site within the cover area 500 of the first fastening device 50 that is embodied as a cylindrical cut-out. Furthermore, alternatively the middle point 52 of the circle segment 321 in the projection onto the surface of the base plate 5 lies in the region 502 between the first fastening device 50 and the adjacent edge 504 of the base plate 5.

Figure 10:
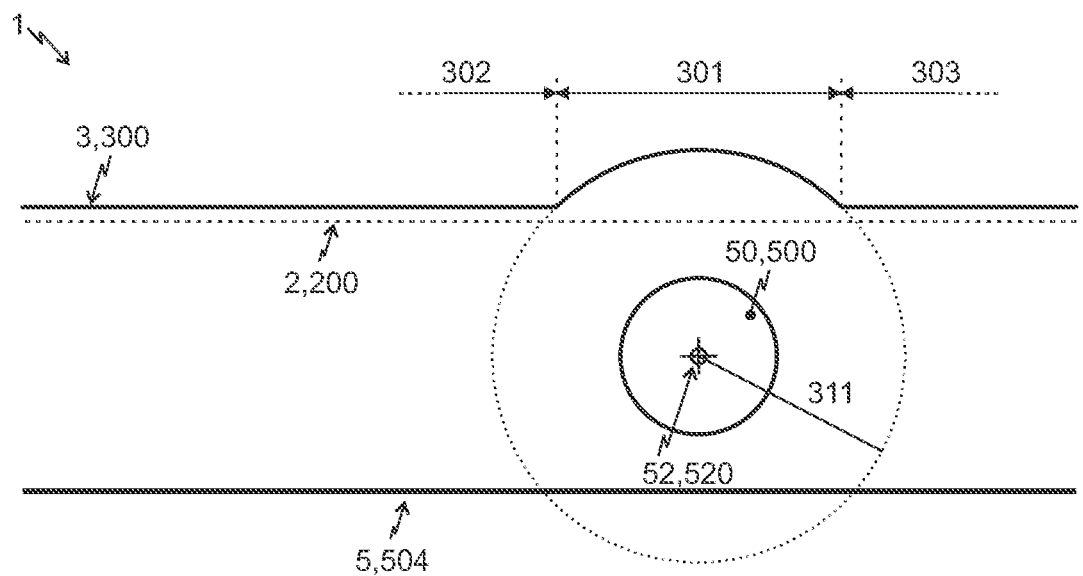

A narrow side of a base plate 5 comparable to FIG. 4 is illustrated in FIG. 10. A first fastening device 50 that is in turn embodied as a through-going cylindrical cut-out is arranged In the middle of this narrow side. The insulating molded body 2, which has its edge 200, and the metal layer on its first main face 20 is furthermore illustrated by the dashed line, cf. FIG. 1. The second and third edge section 302, 303 that are each embodied in an identical manner as described with reference to FIG. 4 adjoin respectively this first edge section 301. The first edge section 301 is in turn embodied with a concave progression, in this case likewise again embodied as a circle segment 321. The same applies with regard to the middle point of the circle or of the circle segment 321 as already mentioned with reference to FIG. 9.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. An electronic power unit, comprising:
a substrate having a perpendicular direction (N) and a flat insulating molded body and with a metal layer on its first main face and a plurality of conductor tracks on its second main face;
a first and a second fastening device and at least one of said first and said second fastening devices is adaptively embodied as a cylindrical cut-out;
the substrate is arranged in at least one of a non-positive locking and a materially-bonded manner on a base plate of the electronic power unit;
the first fastening device is provided so as to arrange the base plate in said non-positive locking manner on a cooling device;
a housing section has said second fastening device so as to arrange the substrate in said non-positive locking manner on said cooling device;
wherein an edge of the metal layer is offset to a rear with respect to an edge of the insulating molded body; and
wherein in a region adjacent to at least one of the first and the second fastening devices a first edge section of the edge of the metal layer is offset to the rear further than in each case adjoining respective second and third edge sections of the edge of the metal layer.

2. The electronic power unit, according to claim 1, wherein:
the conductor tracks are embodied from a further metal layer that is itself structured.

3. The electronic power unit, according to claim 2, wherein:
the first edge section has a length of at least five times and less than a maximum of fifty times a thickness of the metal layer.

4. The electronic power unit, according to claim 3, wherein:
a materially bonded connection is embodied as a solder or sinter connection.

5. The electronic power unit, according to claim 4, wherein:
the first edge section has a minimum distance from the first fastening device and said minimum distance is at least ten times and less than a maximum of three hundred times a thickness of the materially bonded connection.

6. The electronic power unit, according to claim 5, wherein:
the first edge section has one of a concave, straight, and a convex progression.

7. The electronic power unit, according to claim 6, wherein:
the first edge section has said concave progression; and
whereas said concave progression describes a circle segment, having when viewed in the perpendicular direction (N) a middle point of the circle segment within a cover area centrally in the cover area of one of the first and the second fastening devices that is embodied as said cylindrical cut-out.

8. The electronic power unit, according to claim 6, wherein:
the first edge section has said concave progression; and
said concave progression describes a circle segment, having when viewed in the perpendicular direction (N) a middle point of the circle segment in a region between the first fastening device and the adjacent edge of the base plate.

9. The electronic power unit, according to claim 6, wherein:
the first edge section has said concave progression; and
said concave progression describes a circle segment, having when viewed in the perpendicular direction (N) a middle point of the circle segment in the region between the second fastening device and an adjacent edge of a housing section.

10. A semiconductor power module, comprising:
an electronic power unit according to claim 1; and
wherein a power semiconductor element arranged on one of the conductor tracks of the substrate, having an internal connection device and having connection elements for the external connection in an electrical manner of the substrate.

11. The semiconductor power module, according to claim 10, wherein:
the connection elements are embodied as load and auxiliary connection elements.

12. The semiconductor power module, according to claim 11, wherein:
the connection elements protrude outward through a housing.

13. The semiconductor power module, according to claim 12, wherein:
the substrate is arranged in one of said non-positive locking and said materially-bonded manners on said base plate of the electronic power unit; and
the first fastening device is embodied as said cylindrical cut-out.

14. The semiconductor power module, according to claim 13, wherein:
a housing has a further cylindrical cut-out that is flush with the first fastening device that is embodied as a cylindrical cut-out.

* * * * *